United States Patent
Shimizu

(10) Patent No.: US 7,483,103 B2
(45) Date of Patent: Jan. 27, 2009

(54) ELECTRO-OPTICAL DEVICE, METHOD OF MANUFACTURING THE SAME, AND ELECTRONIC APPARATUS

(75) Inventor: Yuichi Shimizu, Hokuto (JP)

(73) Assignee: Seiko Epson Corporation, Tokyo (JP)

( * ) Notice: Subject to any disclaimer, the term of this patent is extended or adjusted under 35 U.S.C. 154(b) by 644 days.

(21) Appl. No.: 11/210,876

(22) Filed: Aug. 25, 2005

(65) Prior Publication Data
US 2006/0088718 A1   Apr. 27, 2006

(30) Foreign Application Priority Data
Oct. 22, 2004   (JP) ............................. 2004-307749

(51) Int. Cl.
G02F 1/1337   (2006.01)
(52) U.S. Cl. .................... 349/125; 349/123; 349/187
(58) Field of Classification Search .................. 349/123, 349/125, 187
See application file for complete search history.

(56) References Cited

U.S. PATENT DOCUMENTS

| 6,665,033 | B2 | 12/2003 | Callegari et al. |
| 7,097,884 | B2 | 8/2006 | Callegari et al. |
| 2002/0135721 | A1 | 9/2002 | Fijol |
| 2004/0151911 | A1 | 8/2004 | Callegari et al. |

FOREIGN PATENT DOCUMENTS

| CN | 1 478 214 A | 2/2004 |
| JP | A 2-178628 | 7/1990 |
| JP | A 4-345128 | 12/1992 |
| JP | A 08-053755 | 2/1996 |
| JP | A 2003-167255 | 6/2003 |
| JP | A 2004-170744 | 6/2004 |

*Primary Examiner*—Thoi V Duong
(74) *Attorney, Agent, or Firm*—Oliff & Berridge, PLC

(57) ABSTRACT

A method of manufacturing an electro-optical device including a pair of substrates with an electro-optical material interposed therebetween includes forming an alignment film made of an inorganic material on a substrate surface of at least one of the substrates opposite to the electro-optical material by fixing an angle between the substrate surface and a scattering direction of the inorganic material to a predetermined value and performing a PVD method, in a processing chamber; and, after the PVD method starts, introducing at least one kind of repair gas for repairing defects of the alignment film into the processing chamber.

10 Claims, 11 Drawing Sheets

ELECTRO-OPTICAL DEVICE, METHOD OF MANUFACTURING THE SAME, AND ELECTRONIC APPARATUS

This application claims the benefit of Japanese Patent Application No. 2004-307749, filed Oct. 22, 2004. The entire disclosure of the prior application is hereby incorporated by reference herein in its entirety.

BACKGROUND OF THE INVENTION

1. Technical Field

The present invention relates to a method of manufacturing an electro-optical device such as a liquid crystal device, to an electro-optical device manufactured by the method, and to an electronic apparatus including the electro-optical device, such as a liquid crystal projector.

2. Related Art

In an electro-optical device manufactured by this manufacturing method, alignment of an electro-optical material which is interposed between a pair of substrates bonded to each other by a sealing material is controlled by an inorganic alignment film formed on a substrate surface opposite to the electro-optical material in one substrate between the pair of substrates. When the electro-optical device is manufactured, the inorganic alignment film is formed by an oblique evaporation method.

Here, in Japanese Unexamined Patent Application Publication No. 8-53755, a technique for depositing ferromagnetic metal on a high molecular film using the oblique evaporation method is disclosed. According to Japanese Unexamined Patent Application Publication No. 8-53755, when the ferromagnetic metal is disposed by using a high incident angle component and a low incident angle component, ionized oxygen gas is injected into the high incident angle component to ionize the ferromagnetic metal, so that the adhesion efficiency of the ferromagnetic metal is improved.

However, in the inorganic alignment film formed on the substrate surface using the oblique evaporation method, for example, since a dangling bond exists in the surface and inside thereof, an electrically unstable defect portion is generated and thus high film quality cannot be obtained. In the electrically unstable defect portion of the inorganic alignment film, for example, water reacts to form a hydroxyl group. Also, a component of the sealing material coated on the inorganic alignment film may react to the hydroxyl group causing a contamination material to be diffused into the inorganic alignment film. When the contamination material is diffused in the inorganic alignment layer, the alignment of the electro-optical material may not be normally controlled. Also, instead of or in addition to diffusion of the contamination material, in the defect portion, the alignment of the electro-optical material cannot be controlled by an electrical change. When the alignment failure occurs, display image quality of the electro-optical device is deteriorated by light leakage.

Furthermore, the inorganic alignment film is formed of an inorganic material which has a low film density and is likely to absorb moisture, such as silica ($SiO_2$). Accordingly, the electro-optical material may come in contact with a pixel electrode contained in a base of the inorganic alignment film. Also, moisture that is absorbed into the inorganic alignment film is diffused into the inorganic alignment film and may permeate into the pixel electrode of the base causing damage the pixel electrode.

As a result, the yield of the process of manufacturing the electro-optical device decreases and it is difficult to increase the life span of the electro-optical device.

SUMMARY

An advantage of the invention is that it provides a method of manufacturing an electro-optical device which can display an image having high quality, increase life span, and improve yield, the electro-optical device manufactured by the manufacturing method, and an electronic apparatus including the electro-optical device, such as a liquid crystal projector.

According to an aspect of the invention, there is provided a method of manufacturing an electro-optical device including a pair of substrates with an electro-optical material interposed therebetween, including: forming an alignment film made of an inorganic material on a substrate surface of at least one of the substrates opposite to the electro-optical material by fixing an angle between the substrate surface and a scattering direction of the inorganic material to a predetermined value and performing a PVD method, in a processing chamber; and, after the PVD method starts, introducing at least one kind of repair gas for repairing defects of the alignment film into the processing chamber.

In the electro-optical device manufactured by the method of manufacturing the electro-optical device of the invention, the electro-optical material, for example, a liquid crystal, is interposed between the pair of the substrates. When the electro-optical device is not driven, the electro-optical material is aligned in a predetermined manner between the pair of substrates by the alignment film made of the inorganic material, that is, surface shape effect of the inorganic alignment film. When the electro-optical device is driven, a voltage according to an image signal is applied to the electro-optical material for each pixel to change the alignment state of the electro-optical material so that light incident from a light source is modulated. Also, the light modulated by the electro-optical material is emitted as display light and thus image display is performed.

In the alignment film forming step of the method of manufacturing the electro-optical device of the invention, the alignment film is formed on the substrate surface of one of the pair of the substrates opposite to the electro-optical material by, for example, an oblique evaporation method or an ion beam sputtering method as the PVD (Physical Vapor Deposition) method in the processing chamber.

Here, a laminated structure made of an interconnection or a driving element for driving an pixel electrode as a base of the alignment film is previously formed on the substrate surface and the pixel electrodes are formed on the uppermost surface of the laminated structure in a predetermined pattern such as an island shape or a stripe shape for each pixel. Alternatively, the laminated structure made of a light-shielding film for defining an opening region for each pixel and counter electrodes provided on the uppermost surface to be opposite to a plurality of the pixel electrodes may be formed on the substrate surface.

In the processing chamber, for example, the PVD method is performed by an oblique evaporation method, the vapor flow of the inorganic material such as silica ($SiO_2$) is generated. Further, the substrate surface having the above-mentioned laminated structure formed thereon is disposed so that an angle between the substrate surface and a moving direction, that is, a scattering direction of the inorganic material is fixed to a predetermined value.

Furthermore, the vapor flow of the inorganic material contacts with the uppermost surface of the laminated structure and thus the inorganic material is deposited on the laminated structure. The inorganic material deposited on the substrate surface is arranged so that the angle between the columnar structure of the inorganic material and the substrate surface forms a predetermined angle. An electrically unstable defect portion may be generated in the surface or the inside of the alignment film by, for example, a dangling bond.

Subsequently, in the step of introducing the repair gas, after the PVD method such as the oblique evaporation method starts, for example, hydrogen ($H_2$), oxygen ($O_2$), or nitrogen ($N_2$) is introduced into the processing chamber as the repair gas for electrically repairing and stabilizing the defect portion of the alignment film. More concretely, at least one kind of the repair gas is successively or intermittently introduced into the processing chamber. At this time, before the PVD method is finished in the processing chamber, the introduction of the repair gas is finished. Alternatively, the repair gas may be successively introduced after the PVD method is finished, and then introduction of the repair gas may be finished. Further, after the PVD method is finished, the repair gas may be introduced. Furthermore, carrier gas such as argon (Ar) may be contained in the repair gas.

The vapor flow of the inorganic material contacts with the repair gas or the repair gas contacts with the inorganic material deposited on the substrate surface.

Thus, the dangling bond which exists in the vaporized inorganic material reacts to oxygen ($O_2$) as the repair gas and thus the oxygen atoms (O) are introduced into the inorganic material. Thus, the dangling bond is cut and the inorganic material is deposited on the substrate surface in a state where the electrical defect portion is repaired.

Furthermore, the repair gas contacts with the inorganic material deposited on the substrate surface and thus the oxygen ($O_2$) reacts to the dangling bond which exists in the inorganic material. Thus, the dangling bond is cut and thus the electrical defect portion can be repaired.

Moreover, even when the ion beam sputtering method is performed as the PVD method in the processing chamber, the repair gas comes in contact with the inorganic material which flies toward the substrate surface to deposit the inorganic material on the substrate surface in a state where the electrical defect portion is repaired, similar to the oblique evaporation method. Alternatively, the repair gas comes in contact with the inorganic material deposited on the substrate surface and thus the electrical defect portion can be repaired.

Thereafter, after the introduction of the repair gas is finished and the formation of the alignment film is finished, the substrate having the alignment film formed thereon is carried into a separate chamber and bonded to the other substrate through a sealing material, and the electro-optical material is then injected between a pair of the substrates, thereby forming the electro-optical device.

Accordingly, in the method of manufacturing the electro-optical device of the invention, the alignment film of which the electrically unstable defect portion is repaired, that is, the alignment film having good film quality can be obtained. Accordingly, the electrical variation of the alignment film can be suppressed. For example, after the alignment film is formed, the non-cured sealing material component can be prevented from being diffused as a contamination material when the substrates are bonded. As a result, the alignment control of the electro-optical material of the alignment film can be normally performed and the alignment failure can be prevented from occurring. Thus, the light leakage can be prevented from occurring. Accordingly, an image having high quality can be displayed in the electro-optical device.

According to another aspect of the invention, in the step of introducing the repair gas, when oxygen ($O_2$) or nitrogen ($N_2$) as the repair gas is introduced into the processing chamber to repair the electrical defect portion in the inorganic material, oxygen atoms (O) or nitrogen atoms (N) are introduced into the inorganic material to form the alignment film as a film having high film density, that is, a precise film. Accordingly, by forming the alignment film as the precise film, the electro-optical material can be prevented from contacting with the pixel electrode or the opposite electrode contained in the base of the alignment film.

Moreover, by forming the alignment film as the precise film having high quality, moisture absorbed into the alignment film is diffused in the alignment film and can be prevented from permeating into the pixel electrode.

Accordingly, in the method of manufacturing the electro-optical device of the invention, the yield can be improved. Further, in the electro-optical device manufactured by the method of manufacturing the electro-optical device, water-proofing and moisture resistance are improved and the life span of the electro-optical device can increase.

According to a further aspect of the method of manufacturing the electro-optical device of the invention, in the step of introducing the repair gas, the introduction of the repair gas is finished before the PVD method is finished.

According to the present aspect, when the oblique evaporation method is performed as the PVD method in the processing chamber, the repair gas comes in contact with the vapor flow of the inorganic material and thus the inorganic material can be deposited on the substrate surface in a state where the electrical defect portion is repaired. Alternatively, the repair gas comes in contact with the inorganic material deposited on the substrate surface, and thus the defect portion of the deposited inorganic material can be repaired.

According to a still further aspect of the method of manufacturing the electro-optical device of the invention, in the step of introducing the repair gas, the introduction of the repair gas starts after the PVD method is finished.

According to the present aspect, when the oblique evaporation method is performed as the PVD method, the repair gas comes in contact with the vapor flow of the inorganic material and thus the inorganic material can be deposited on the substrate surface in a state where the electrical defect portion is repaired. Alternatively, the repair gas comes in contact with the inorganic material deposited on the substrate surface, and thus the defect portion of the deposited inorganic material can be repaired.

Here, if the PVD method is finished, the deposition of the inorganic material on the substrate surface is finished. Accordingly, even when the PVD method is finished, the repair gas is successively introduced into the processing chamber and comes in contact with the uppermost surface of the alignment film. Thus, in addition to the inside of the alignment film, the electrical defect portion of the uppermost surface can be more reliably repaired. Accordingly, in the present aspect, in addition to the inside of the alignment film, the film quality of the uppermost surface is good and thus the electrical variation of the entire alignment film can be more reliably suppressed. Here, it is preferable that gas having high reactivity, such as fluorine ($F_2$) or ozone ($O_3$), is introduced into the processing chamber as the repair gas, after the PVD method is finished. Then, the electrical defect portion of the uppermost surface of the alignment film can be more surely repaired.

According to another aspect of the method of manufacturing the electro-optical device of the invention, in the step of introducing the repair gas, at least two kinds of the repair gases are successively introduced into the processing chamber.

According to the present aspect, by converting the repair gas as mentioned below, the film quality of the alignment film can be gradually changed.

After the PVD method starts, for example, oxygen ($O_2$) or nitrogen ($N_2$) as the repair gas is introduced into the processing chamber in an initial stage of performing the PVD method, and thus an initial film of the alignment film can be formed as a precise film. Thereafter, upon finishing the PVD method, the repair gas is converted into gas having high reactivity, such as fluorine ($F_2$) or ozone ($O_3$), and introduced into the second processing chamber. Thus, the film quality at the vicinity of the uppermost surface of the alignment film is more reliably improved. Accordingly, for example, in the uppermost surface of the alignment film, the alignment failure of the electro-optical material can be prevented from occurring, the pixel electrode or the opposite electrode composing the base of the alignment film can be prevented from contacting with the liquid crystal by the precise initial film, and water-proofing and moisture resistance can be ensured.

Alternatively, instead of or in addition to forming the precise film as the initial film of the alignment film, the uppermost surface of the alignment film is formed of the precise film having high quality.

According to a still further aspect of the method of manufacturing the electro-optical device of the invention, in the step of introducing the repair gas, the repair gas is intermittently introduced into the processing chamber.

According to the present aspect, by intermittently introducing at least one kind of repair gas into the processing chamber, the film quality of the alignment film can gradually change and the defect portion of the alignment film can be efficiently repaired.

After the PVD method starts, for example, oxygen ($O_2$) or nitrogen ($N_2$) as the repair gas is introduced into the processing chamber in an initial stage of performing the PVD method, and thus an initial film of the alignment film can be formed as a precise film. Thereafter, the introduction of the repair gas is interrupted and the PVD method is performed. Subsequently, upon finishing the PVD method, oxygen ($O_2$) or nitrogen ($N_2$) is again introduced into the processing chamber as the repair gas to repair the defect portion at the vicinity of the uppermost surface of the alignment film and to form a precise film at the vicinity of the uppermost surface. Further, upon finishing the PVD method, the repair gas may be converted into gas having high reactivity, such as fluorine ($F_2$) or ozone ($O_3$), and introduced into the second processing chamber.

Accordingly, although an electrically unstable defect portion resides inside the alignment film, the electrical variation of the uppermost surface of the alignment film can be suppressed and thus the alignment failure of the electro-optical material can be prevented. Also, by forming the initial film of the alignment film as the precise film, the pixel electrode or the opposite electrode composing the base of the alignment film can be prevented from contacting with the electro-optical material by the precise initial film, and water-proofing and moisture resistance can be ensured. Alternatively, in addition to the initial film of the alignment film, the uppermost surface of the alignment film is formed of the precise film having good quality, and thus water-proofing and moisture resistance can be more reliably ensured.

Accordingly, according to the present aspect, although a large quantity of the repair gas is not introduced into the processing chamber, the film quality of the alignment film can be improved.

According to a still further aspect of the method of manufacturing the electro-optical device of the invention, in the step of introducing the repair gas, the introduction of the repair gas starts after the PVD method is finished.

According to the present aspect, the repair gas comes in contact with the uppermost surface of the alignment film and thus the electrical defect portion of the uppermost surface of the alignment film can be more reliably repaired. Accordingly, although an electrically unstable defect portion resides inside the alignment film, the electrical variation of the uppermost surface of the alignment film can be suppressed and thus the alignment failure of the electro-optical material can be prevented. Also, by forming the uppermost surface of the alignment film as the precise film, the pixel electrode or the opposite electrode composing the base of the alignment film can be prevented from contacting with the electro-optical material by the precise initial film, and water-proofing and moisture resistance can be ensured.

According to a still further aspect of the method of manufacturing the electro-optical device of the invention, in the step of introducing the repair gas, the repair gas is ionized and supplied so that an angle between the substrate surface and a moving direction of the repair gas corresponds to an angle between the substrate surface and a columnar structure of the inorganic material of the alignment film.

According to the present aspect, after the PVD method starts, the repair gas is ionized and introduced into the processing chamber. In the processing chamber, the ionized repair gas is supplied so that the angle between the substrate surface and the moving direction of the repair gas corresponds to the angle between the substrate surface and a columnar structure of the inorganic material on the substrate surface, and thus the repair gas having high reactivity can effectively come in contact with the columnar structure of the inorganic material deposited on the substrate surface. Accordingly, the defect portion of the deposited inorganic material can be efficiently and more surely repaired.

According to a still further aspect of the method of manufacturing the electro-optical device of the invention, in the step of introducing the repair gas, at least one kind of gas mixture of nitrogen, argon and hydrogen, fluorine, oxygen, and ozone is used as the repair gas.

According to the present embodiment, after the PVD method starts, gas mixture of nitrogen ($N_2$), argon (Ar) and hydrogen ($H_2$), fluorine ($F_2$), oxygen ($O_2$), and ozone ($O_3$) is introduced into the processing chamber. Thus, the dangling bond which exists in the inorganic material is cut, and thus the defect portion of the inorganic material can be repaired. Here, it is preferable that hydrogen ($H_2$) is mixed with carrier gas such as argon (Ar) and introduced into the processing chamber as the repair gas. Also, by using nitrogen ($N_2$) and oxygen ($O_2$) as the repair gas, the alignment film can be formed as the precise film. Alternatively, by using fluorine ($F_2$), oxygen ($O_2$), and ozone ($O_3$) as the repair gas, the electrical defect portion of the alignment film can be more reliably and rapidly repaired.

According to a still further aspect of the method of manufacturing the electro-optical device of the invention, in the step of forming the alignment film, the PVD method is performed by an oblique evaporation method.

According to the present aspect, the vapor flow of the inorganic material comes in contact with the uppermost surface of the laminated structure, and the columnar structure of the inorganic material is formed on the substrate surface, thereby forming the alignment film.

According to a still further aspect of the method of manufacturing the electro-optical device of the invention, in the step of forming the alignment film, the PVD method is performed by an ion beam sputtering method.

According to the present aspect, by adjusting the angle between the scattering direction of the inorganic material and the substrate surface, the columnar structure of the inorganic material is arranged on the substrate surface to form the alignment film, similar to using the oblique evaporation method as the PVD method.

According to a still further the invention, there is provided an electro-optical device including: a pair of substrates that interpose an electro-optical material; and an alignment film of which defects are repaired by (i) forming an inorganic material on a substrate surface of at least one of the substrates opposite to the electro-optical material by fixing an angle between the substrate surface and a scattering direction of the inorganic material to a predetermined value and performing a PVD method, in a processing chamber, and (ii) after the PVD method starts, introducing at least one kind of repair gas for repairing defects of the alignment film into the processing chamber.

Since the electro-optical device of the invention is manufactured by the method of manufacturing the electro-optical device of the above-mentioned invention, an image having high quality can be displayed and thus the life span can increase.

According to a still further aspect of the invention, there is provided an electronic apparatus comprising the above-mentioned electro-optical device.

Since the electronic apparatus of the invention includes the above-mentioned electro-optical device of the invention, an image having high quality can be displayed and thus the life span can increase. Various electronic apparatuses such as a projection display device, a television, a cellular phone, an electronic organizer, a word processor, a view-finder-type or monitor-direct-view-type video tape recorder, a workstation, a video phone, a POS terminal, and a touch panel can be realized. Also, the electronic apparatus of the invention, for example, an electrophoretic device such as an electronic paper, and a field emission display and conduction electron-emitter display can be realized, and as a device using the electrophoretic device or the field emission display and conduction electron-emitter display, a digital light processing (DLP) can be realized.

The effects and advantage of the invention will be apparent from embodiments described below.

BRIEF DESCRIPTION OF THE DRAWINGS

The invention will be described with reference to the accompanying drawings, wherein like numbers reference like elements, and wherein.

DESCRIPTION OF THE EMBODIMENTS

Hereinafter, embodiments of the present invention will be described with reference to the accompanying drawings. In the embodiment below, a TFT active matrix driving type liquid crystal device having a driving circuit built-in which is an example of an electro-optical device according to the present invention is described.

<1: Construction of Electro-Optical Device>

First, the entire construction of the electro-optical device according to the present embodiment will be described with reference to FIGS. 1 and 2.

Figure 1:
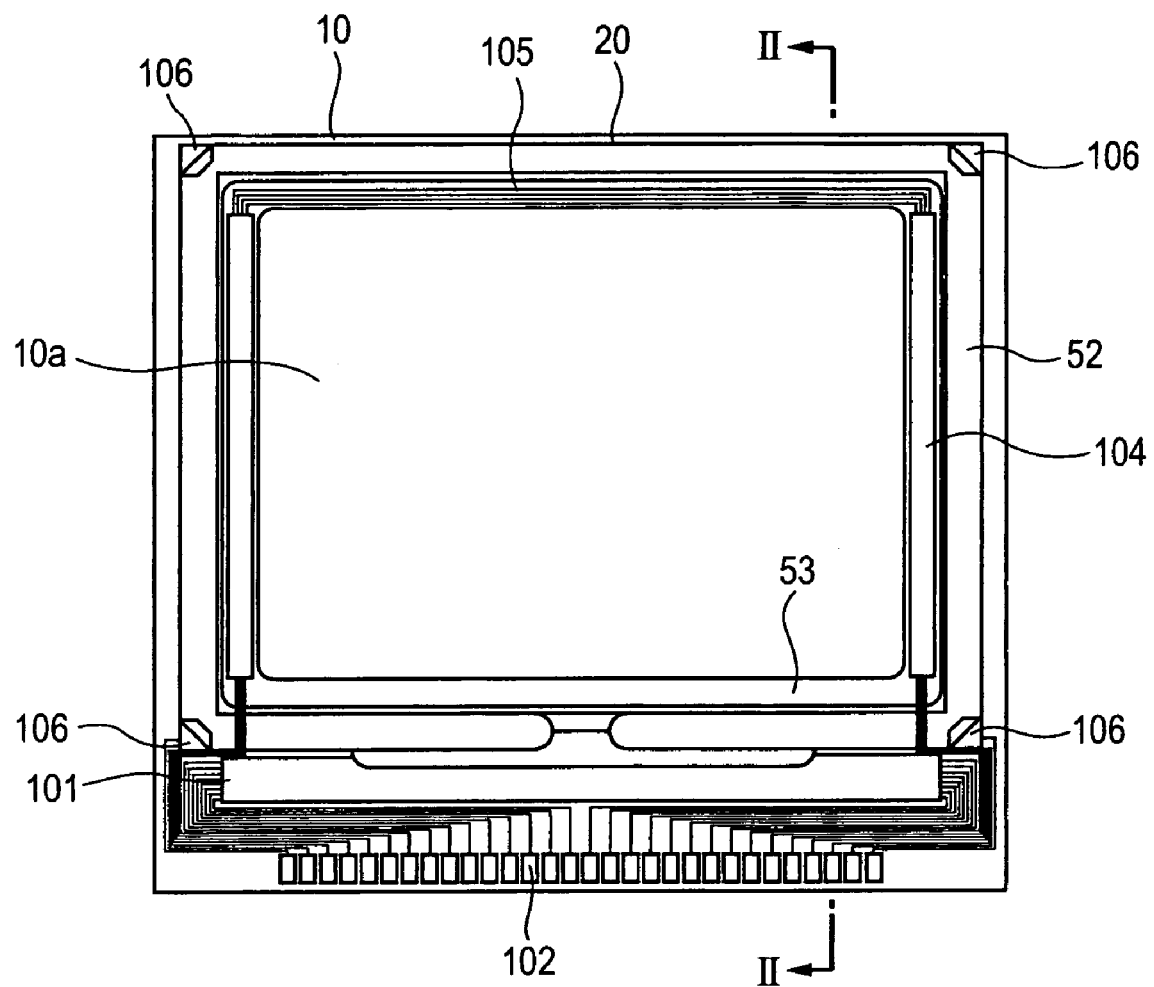
FIG. 1 is a plan view illustrating an entire structure of an electro-optical device according to the present embodiment.
Figure 2:
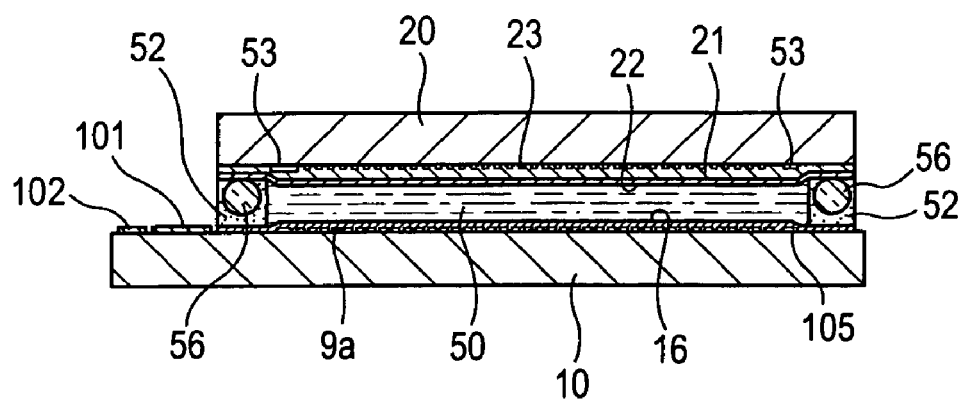
FIG. 2 is a cross-sectional view taken along II-II line of FIG. 1.

FIG. 1 is a plan view of a TFT array substrate together with components formed thereon when viewed at a counter substrate side, and FIG. 2 is a cross-sectional view taken along line H-H' of FIG. 1. In addition, the scale of each layer or member has been adjusted in order to have a recognizable size in the drawings.

In FIGS. 1 and 2, in the electro-optical device according to the present embodiment, the TFT array substrate 10 and the counter substrate 20 are opposite to each other. A liquid crystal layer 50 is filled between the TFT array substrate 10 and the counter substrate 20, and the TFT array substrate 10 and the counter substrate 20 are bonded to each other by a sealing material 52 provided in a sealing region located at the vicinity of an image display region 10a.

The sealing material 52 is composed of, for example, an ultraviolet-ray curing resin, heat curing resin, or ultraviolet-ray and heat curing resin for adhering both substrates, and is coated on the TFT array substrate 10 and then cured by irradiating ultraviolet rays or performing heat treatment. In the sealing material 52, gap materials 56 such as glass fiber or glass beads for maintaining a gap between the TFT array substrate 10 and the counter substrate 20 to a predetermined value are dispersed. In FIG. 2, the spherical glass beads are mixed in the sealing material 52 as the gap material 56. Also, in addition to or instead of mixing the gap materials 56 in the sealing material 52, the gap materials may be arranged in the image display region 10a or a peripheral region located at the vicinity of the image display region 10a.

In FIG. 1, a frame light-shielding film 53 defining a frame region of the image display region 10a is provided at the side of the counter substrate 20 in parallel to the inside of the sealing region in which the sealing material 52 is arranged. Here, a portion or all of the frame light-shielding film 53 may be provided at the side of the TFT array substrate 10 as a built-in light-shielding film.

A data line driving circuit 101 and an external circuit connecting terminal 102 are provided at one side of the TFT array substrate 10 in a region located outside of the sealing region in which the sealing material 52 is arranged in the peripheral region. Also, a scan line driving circuit 104 is provided so as to be covered by the frame light-shielding film 53 along two sides adjacent to one side. Further, in order to connect two scan line driving circuits 104 provided at both sides of the image display region 10a, a plurality of wiring lines 105 are provided to be covered by the frame light-shielding film 53 along the other side of the TFT array substrate 10.

Furthermore, vertical conductive materials 106 which function as vertical conductive terminals between both substrate are disposed at four corners of the counter substrate 20. On the other hand, vertical conductive terminals are provided at the regions opposite to the corners in the TFT array substrate 10. Thus, the TFT array substrate 10 and the counter substrate 20 are electrically connected to each other.

In FIG. 2, a laminated structure having pixel switching TFTs (thin film transistor) which are the driving elements and wiring lines such as scan lines or data lines are formed on the TFT array substrate 10. In the detailed construction of the laminated structure, a pixel electrode 9a made of a transparent material such as ITO (indium tin oxide) is formed on the uppermost layer of the laminated structure in an island shape in a predetermined pattern for each pixel, but is not shown in FIG. 2. Also, an alignment film 16 made of an organic material such as silica ($SiO_2$) is provided on the pixel electrode 9a.

On the other hand, a light-shielding film 23 is formed on the surface of the counter substrate 20 opposite to the TFT array substrate 10. The light-shielding film 23 is formed on the opposite surface of the counter substrate 20 in a grid shape when viewed in a plan view. In the counter substrate 20, a non-opening region is defined by the light-shielding film 23 and a region defined by the light-shielding film 23 is an opening region. Also, the light-shielding film 23 may be formed in a stripe shape so that the non-opening region is defined by the light-shielding film 23 and various components such as data lines provided at the side of the TFT array substrate 10.

Moreover, counter electrodes 21 made of a transparent material such as ITO are formed on the light-shielding film 23 to be opposite to the plurality of the pixel electrodes 9a. Also, in order to perform color display of the image display region 10a, color filters (not shown in FIG. 2) may be formed in a region including the opening region and the non-opening region of the light-shielding film 23.

On the laminated structure having various components on the opposite surface of the counter substrate 20, an alignment film 22 made of an inorganic material such as silica ($SiO_2$) is formed. The opposite electrode 21 is disposed on the uppermost layer of the laminated structure on the counter substrate 20 and the alignment film 22 is formed on the opposite electrode 21.

Furthermore, the alignment film may be formed on any one opposite surface of the TFT array substrate 10 and the counter substrate 20. Also, any one of the alignment film 16 of the TFT array substrate 10 and the alignment film 22 of the counter substrate 20 may be formed of an organic alignment film obtained by performing a rubbing process to an organic film formed of an organic material such as polyimide. However, the inorganic alignment film has more excellent light resistance than the organic alignment film. Accordingly, in order to increase the life span of the electro-optical device, the inorganic alignment film is used.

Moreover, the liquid crystal layer 50 is made of a liquid crystal in which one kind or several kinds of nematic liquid crystal is mixed and has a predetermined alignment state between a pair of the alignment films 16 and 22 when a voltage is not applied from the pixel electrode 9a. On the TFT array substrate 10, the alignment film 16 is continuously formed in the image display region 10a and a region which extends from the image display region 10a and includes the sealing region of the peripheral region. Also, in the counter substrate 20, the alignment film 22 is formed in the same region as that of the alignment film 16 formed on the TFT array substrate 10.

Further, in addition to the data line driving circuit 101 and the scan line driving circuit 104, a sampling circuit for sampling an image signal on an image signal line to supply it to the data line, a precharge circuit for supplying a precharge signal having a predetermined voltage level to the plurality of data lines prior to the image signal, and a test circuit for testing quality and defects of the electro-optical device when the electro-optical device is manufactured or shipped may be formed on the TFT array substrate 10 shown in FIGS. 1 and 2.

Figure 3:
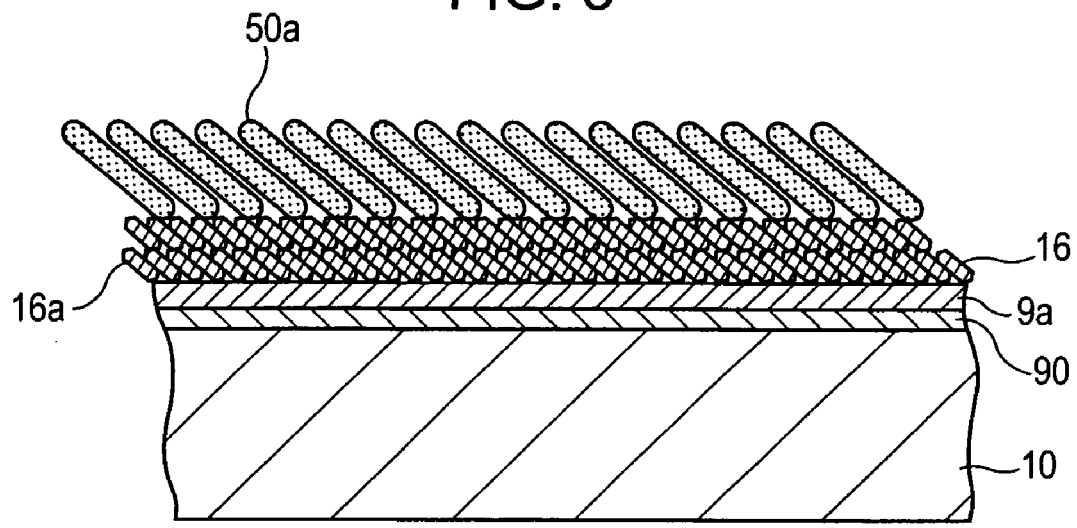
FIG. 3 is a schematic diagram illustrating alignment of liquid crystal of an alignment film.

Here, FIG. 3 schematically illustrates a cross-sectional construction corresponding to FIG. 2, and, particularly, alignment of the liquid crystal by the alignment film 16 formed on the TFT array substrate 10.

In FIG. 3, a laminated structure 90 made of various components such as TFTs is formed on the substrate surface of the TFT array substrate 10 opposite to the liquid crystal layer 50, and the pixel electrode 9a is formed on the uppermost layer of the laminated structure 90 for each pixel. Further, on the pixel electrode 9a, columnar structure 16a made of an inorganic material is arranged at a predetermined angle with the substrate surface of the TFT array substrate 10 and an inorganic material is deposited to form the alignment film 16. The alignment film 16 can align liquid crystal molecules 50a by surface shape effect. Furthermore, the alignment of the liquid crystal by the alignment film 16 described with reference to FIG. 3 is similar to that of alignment film 22 formed on the counter substrate 20.

Figure 4:
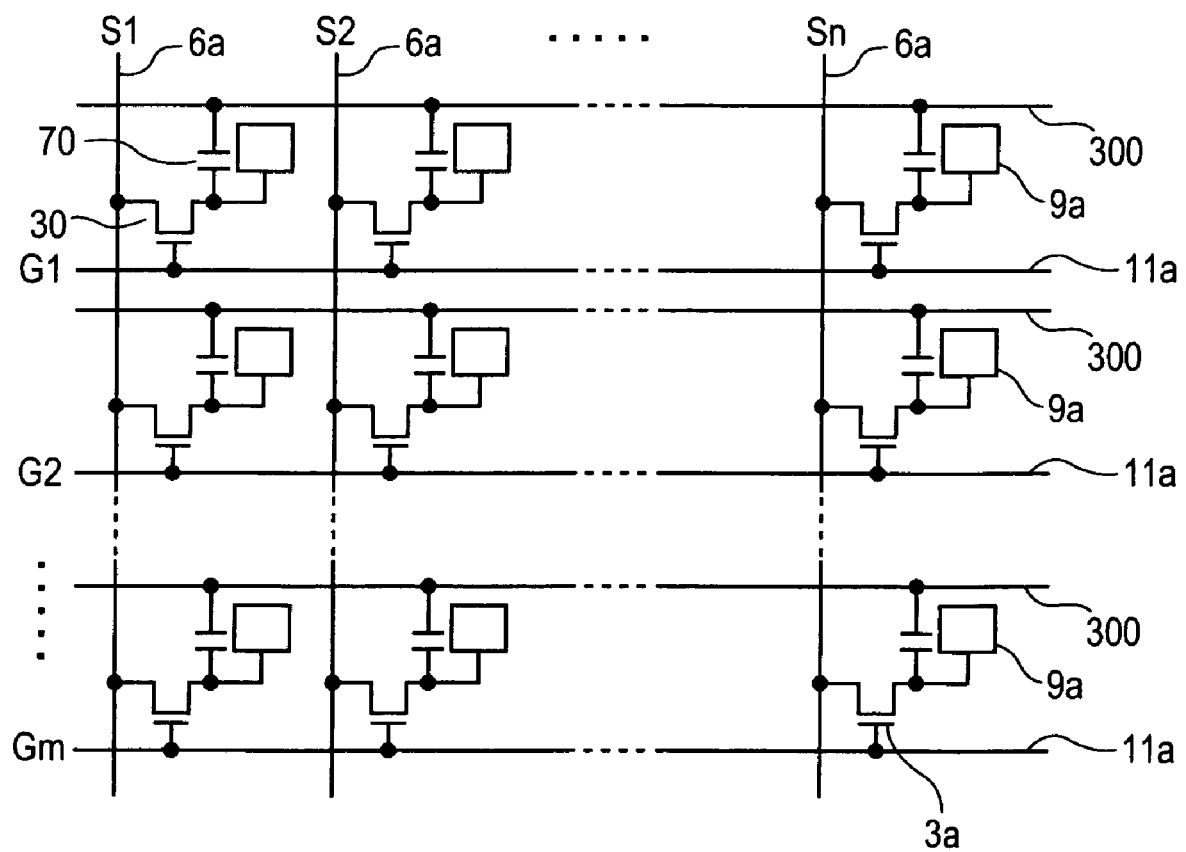
FIG. 4 is an equivalent circuit diagram of various elements and wiring lines of a plurality of pixels.

Next, a circuit construction and operation of the electro-optical device having the above-mentioned construction will be described with reference to FIG. 4. FIG. 4 is an equivalent circuit diagram of various elements and wiring lines of a plurality of pixels which are formed in a matrix and compose the image display region of the electro-optical device.

In FIG. 4, the pixel electrode 9a and the TFT 30 for switching the pixel electrode 9a are formed in each of a plurality of the pixels which are formed in a matrix and compose the image display region 10a of the electro-optical device according to the present embodiment, and the data line 6a for supplying the image signal is electrically connected to a source of the TFT 30. The image signals S1, S2, . . . , and Sn written into the data line 6a may be line-sequentially supplied in this order or may be supplied to a plurality of the adjacent data lines 6a for each group.

Furthermore, a gate electrode 3a is electrically connected to a gate of the TFT 30, and scan signals G1, G2, . . . , and Gm are line-sequentially applied in a pulse manner to the scan line 11a and the gate electrode 3a at a predetermined timing in this order. The pixel electrode 9a is electrically connected to a drain of the TFT 30, and the image signals S1, S2, . . . , and Sn supplied from the data lines 6a are written at a predetermined timing by closing the switch of the TFTs 30 which are the switch elements for a predetermined period.

The image signals S1, S2, . . . , and Sn which have a predetermined level and are written to the liquid crystal which is an example of the electro-optical material through the pixel electrode 9a is held for a predetermined period between the counter electrodes 21 formed on the counter substrate 20. The liquid crystal modulates the light by changing the alignment or the order of the molecules according to the applied voltage level to perform gradation display. In the case of a normally white mode, transmissivity of incident light decreases according to the voltage applied in a unit of each pixel, and, in the case of a normally black mode, the transmissivity of the incident light increases according to the voltage applied in a unit of each pixel. Thus the electro-optical device emits light having contrast according to the image signal.

Here, in order to prevent the held image signal from leaking, a storage capacitance 70 is added in parallel with a liquid crystal capacitance formed between the pixel electrode 9a and the opposite electrode 21. This storage capacitance 70 is provided in parallel with the scan line 11a and includes a capacitance electrode 30 fixed with a constant potential and a fixed potential capacitance electrode.

<2: Method of Manufacturing Electro-Optical Device>

Hereinafter, a process of manufacturing the electro-optical device according to the present embodiment will described with reference to FIGS. 5 to 10.

Figure 5:
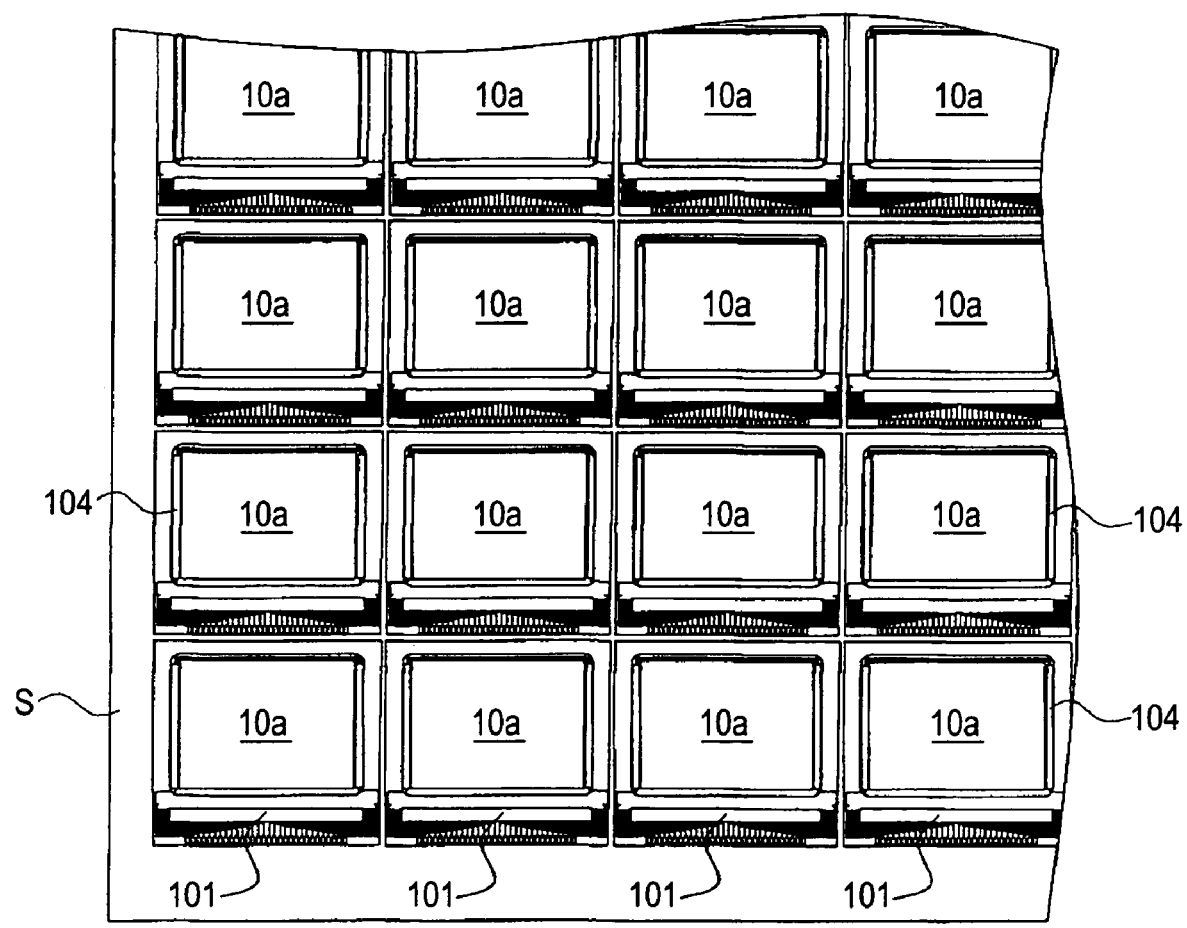
FIG. 5 is a partial plan view illustrating a plurality of electro-optical devices according to the present embodiment which are formed on a glass substrate having a relatively large size at a time.

FIG. 5 is a partial plan view illustrating a plurality of electro-optical devices according to the present embodiment which are formed on a glass substrate having a relatively large size at one time. First, before describing the respective processes of manufacturing the electro-optical device according to the present embodiment, it is assumed that the plurality of the electro-optical devices according to the present embodiment are formed on a glass substrate S having a relatively large size shown in FIG. 5. That is, the electro-optical devices are arranged in a matrix on the glass substrate S, and various components (TFT 30, the scan lines 11a, the data lines 6a, the scan line driving circuit 104, or the data line driving circuit 101) described with reference to FIGS. 1 to 4 are formed in each electro-optical device. In addition, the glass substrate S shown in FIG. 5 corresponds to the TFT array substrate 10 shown in FIGS. 1 and 2.

Furthermore, in FIG. 5, although only the glass substrate S on which the various components are formed and which is the TFT array substrate 10 is shown, the opposite electrode 21 and the alignment film 22 may be formed on a separate glass substrate which is not shown in FIG. 5 to form a plurality of the counter substrate 20. Also, in each electro-optical device, the glass substrate S and the separate glass substrate which is not shown in FIG. 5 are bonded to each other by the sealing material 52 and the liquid crystal is filled between the TFT array substrate 10 and the counter substrate 20. Thereafter, the glass substrate S and the separate glass substrate which is not shown in FIG. 5 are cut to each electro-optical device shown in FIGS. 1 and 2.

Figure 6:
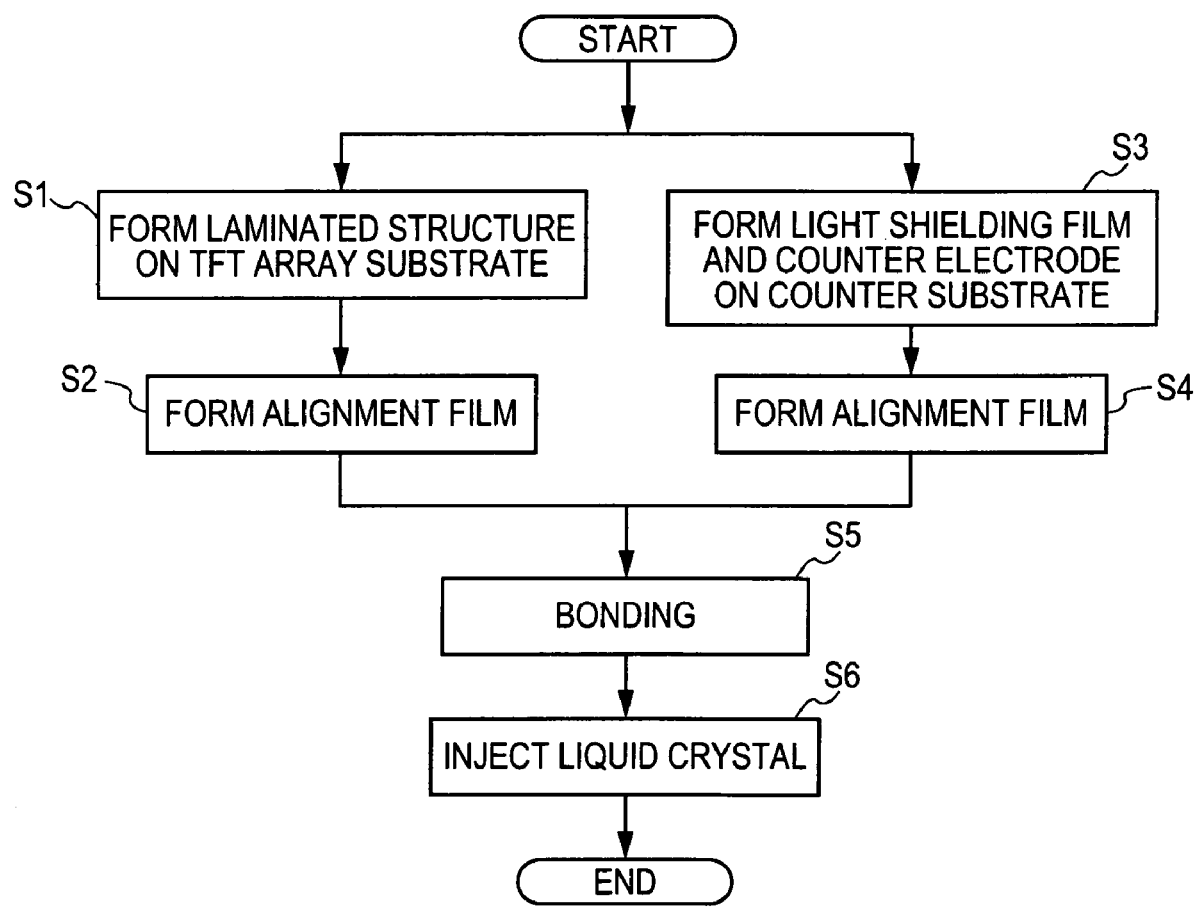
FIG. 6 is a flowchart illustrating each step of a process of manufacturing the electro-optical device according to the present embodiment.
Figure 7:
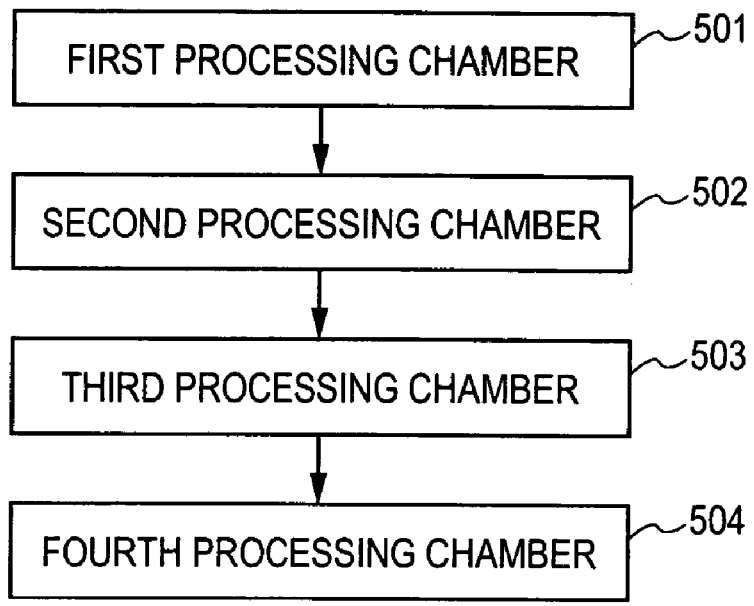
FIG. 7 is a schematic diagram illustrating the flow of each step in an apparatus used for manufacturing the electro-optical device.
Figure 8:
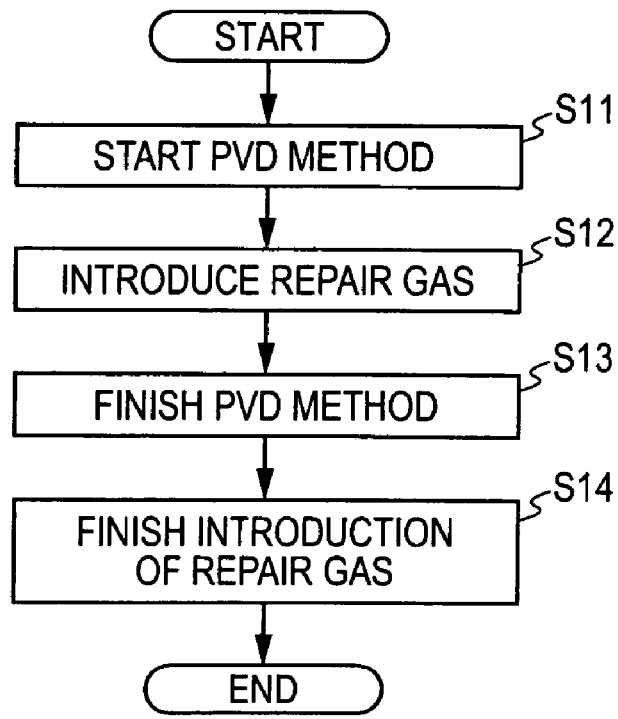
FIG. 8 is a flowchart illustrating each step of a process of manufacturing the alignment film in detail.
Figure 9A:
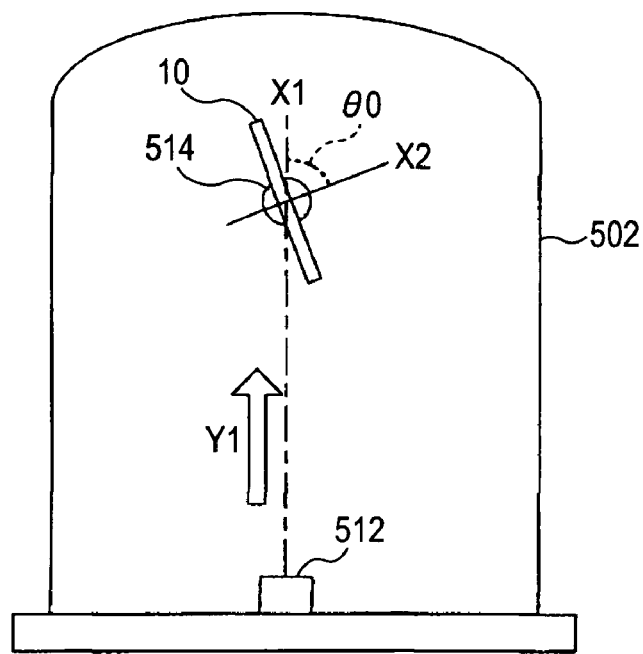
FIG. 9A is a diagram illustrating a construction example of a second processing chamber.
Figure 9B:
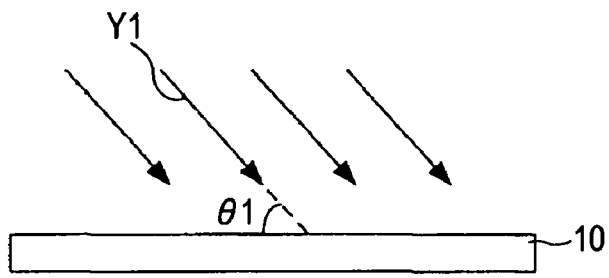
FIG. 9B is a schematic diagram illustrating an arrangement relationship between a scattering direction of an inorganic material and a substrate surface of a TFT array substrate.

Under the above-mentioned construction, the process of manufacturing the electro-optical device according to the present embodiment will be described with reference to FIGS. 6 to 9. FIG. 6 is a flowchart illustrating each step of the process of manufacturing the electro-optical device according to the present embodiment, and FIG. 7 is a schematic diagram illustrating the flow of each step in an apparatus used for manufacturing the electro-optical device. FIG. 8 is a flowchart illustrating each step of the process of manufacturing the alignment film in detail. FIG. 9A illustrates a construction example of a second processing chamber in FIG. 7, and FIG. 9B is a schematic diagram illustrating an arrangement relationship between a scattering direction of an inorganic material and the substrate surface of the TFT array substrate 10.

First, in FIG. 6, in a first processing chamber 501 shown in FIG. 7, the pixel electrode 9a is formed on the uppermost layer of the laminated structure 90 made of the data line 6a, the scan line 11a, and the TFT 30 on the TFT array substrate 10 (step S1).

Subsequently, the TFT array substrate 10 is carried from the first processing chamber 501 to the second processing chamber 502 shown in FIG. 7, and, in the second processing chamber 502, the TFT array substrate is subjected to an oblique evaporation method or an ion beam sputtering method as a PVD (physical vapor deposition) method to form the alignment film 16 on the substrate surface of the TFT array substrate 10 on which the pixel electrode 9a is formed (step S2).

Hereinafter, the step S2 will be described with reference to FIGS. 8 and 9. Also, hereinafter, it is assumed that the alignment film 16 is formed using the oblique evaporation method.

As shown in FIG. 9A, an evaporation source 512 for generating vapor flow of the inorganic material such as silica ($SiO_2$) and a holding tool 514 for maintaining the TFT array substrate 10 are provided in the second processing chamber 502. In the second processing chamber 502, the TFT array substrate 10 is held by the holding tool 514 so that an angle $\theta$ between a reference line X1 joining the evaporation source 512 and the center of the substrate surface of the TFT array substrate 10 and a straight line x2 perpendicularly crossing the substrate surface of the TFT array substrate 10 is a predetermined value. Accordingly, the angle $\theta 1$ between a moving direction of vapor flow of the inorganic material generated at the evaporation source 512 shown by an arrow Y1 in FIGS. 9A and 9B and the substrate surface of the TFT array substrate 10 on which the alignment film 16 is formed can be adjusted by changing the angle $\theta 0$. This angle $\theta 1$ is fixed to a predetermined value for arranging the columnar structure 16a on the substrate surface so that the surface shape effect for controlling the alignment of the alignment film 16 is obtained.

In FIG. 8, the oblique evaporation method starts in a state where the TFT array substrate 10 is held in the second processing chamber 502 (step S11). Thereafter, repair gas such as nitrogen ($N_2$) or oxygen ($O_2$) is introduced into the second processing chamber 502 (step S12).

At this time, the vapor flow of the inorganic material generated at the evaporation source 512 comes in contact with the uppermost surface of the laminated structure 90 on the substrate surface of the TFT array substrate 10 to deposit the inorganic material on the laminated structure 90. Also, the columnar structure 16a of the inorganic material deposited on the substrate surface is arranged at a predetermined angle with the substrate surface so that the inorganic material is deposited on the substrate surface. The angle between the columnar structure 16a and the substrate surface corresponds to the angle θ1 between the moving direction Y1 of the vapor flow of the inorganic material and the substrate surface of the TFT array substrate 10.

Furthermore, while the PVD method is performed, the repair gas is introduced into the second processing chamber 502 so that the repair gas comes in contact with the vapor flow of the inorganic material and the inorganic material deposited on the substrate surface of the TFT array substrate 10.

Here, in the vaporized inorganic material or the inorganic material deposited on the substrate surface, an electrically unstable defect portion may be generated by, for example, a dangling bond. For example, in the case of using silica as the inorganic material, if the repair gas such as nitrogen ($N_2$) comes in contact with the vapor flow of the inorganic material, the dangling bond in the vaporized inorganic material reacts to nitrogen ($N_2$) to form, for example, a coupling (Si—N) of silicon (Si) and nitrogen (N) and cut the dangling bond. Thus, after the electrical defects are repaired, the inorganic material can be deposited on the substrate surface.

Figure 10:
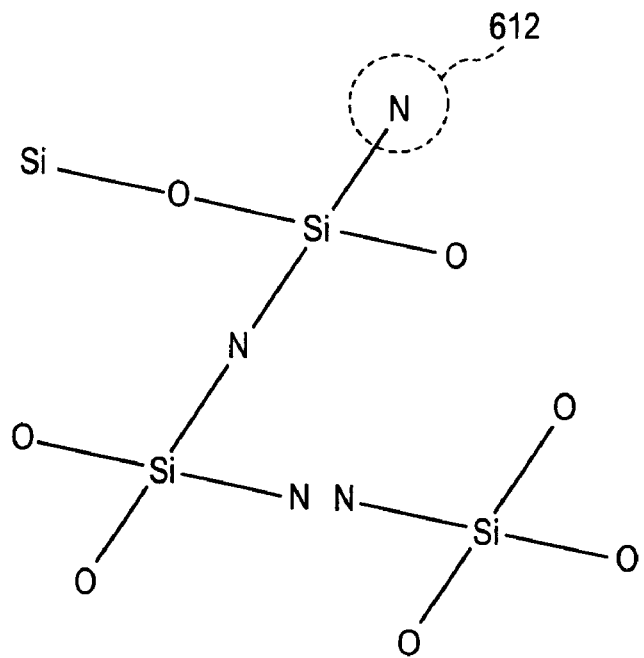
FIG. 10 is a schematic diagram illustrating repair of a defect portion when repair gas contact with the inorganic material.

FIG. 10 schematically illustrates chemical composition of the silica ($SiO_2$) which is the inorganic material deposited on the substrate surface of the TFT array substrate 10 and is a schematic diagram illustrating the repair of a defect portion when the repair gas comes in contact with the inorganic material.

In FIG. 10, in the case of using silica as the inorganic material, a defect portion 612 is generated in the inorganic material deposited on the substrate surface of the TFT array substrate 10 by the dangling bond which exists in, for example, silicon atom (Si). For example, if nitrogen ($N_2$) as the repair gas comes in contact, nitrogen ($N_2$) reacts to the dangling bond of the inorganic material to form, for example, a coupling (Si—N) of silicon (Si) and nitrogen (N) and cut the dangling bond. Thus, the defect portion 612 can be repaired.

Moreover, even in the case of using oxygen ($O_2$) as the repair gas, a defect portion in the inorganic material deposited on the substrate surface of the TFT array substrate 10 or the vapor flow of the inorganic material can be repaired, similar to the case where nitrogen ($N_2$) is used.

Accordingly, in the step S12, the film quality of the inside of the alignment film 16 is good.

Thereafter, the oblique evaporation method is finished while the repair gas is successively introduced into the second processing chamber 502 (step S13). If the oblique evaporation method is finished, the deposition of the inorganic material on the substrate surface of the TFT array substrate 10 is finished and the formation of the alignment film 16 is finished. In this state, the repair gas comes in contact with the uppermost surface of the alignment film 16 and thus the electrical defect portion which exists in the uppermost surface can be reliably repaired. Accordingly, the film quality of the uppermost surface as well as the inside of the alignment film 16 is good and thus electrical variation can be more reliably suppressed in the entire alignment film 16.

Thereafter, the introduction of the repair gas into the second processing chamber 502 is finished (step S14) and thus the step S2 of FIG. 6 is finished.

Furthermore, in the second processing chamber 502, even in the case where the ion beam sputtering method is performed as the PVD method, the repair gas comes in contact with the inorganic material which flies toward the substrate surface of the TFT array substrate 10 so that the inorganic material can be deposited on the substrate surface in a state where the electrical defect portion is repaired, similar to the oblique evaporation method. Further, the repair gas comes in contact with the inorganic material deposited on the substrate surface of the TFT array substrate 10 and thus the electrical defect portion can be repaired.

In FIG. 6, in parallel with, before or after the process of manufacturing the TFT array substrate 10 of the step S1 and the step S2, in the processing chamber which is not shown in FIG. 7, the laminated structure formed of the light-shielding film 23 or the opposite electrode 21 is formed on the counter substrate 20 (step S3), and then the alignment film 22 is formed (step S4). The step S4 is performed in the same order as the step S2 to form the alignment film 22 having high film quality on the counter substrate 20 and thus the electrical variation of the entire alignment film 22 can be more reliably suppressed.

Thereafter, the TFT array substrate 10 and the counter substrate 20 are carried into a third processing chamber 503 shown in FIG. 7 and the surface of the TFT array substrate 10 having the alignment film 16 formed thereon and the surface of the counter substrate 20 having the alignment film 22 formed thereon are bonded to each other through the sealing material 52 (step S5) inside the third processing chamber 503.

Subsequently, the TFT array substrate 10 and the counter substrate 20 which are bonded to each other are carried into a fourth processing chamber 504 shown in FIG. 7 and liquid crystal is injected between the TFT array substrate 10 and the counter substrate 20 in the fourth processing chamber 504 (step S6).

As mentioned above, since the alignment film 16 or 22 having high film quality is formed, the sealing material 52 coated on the TFT array substrate 10 or the counter substrate 20 can be prevented from being diffused into the alignment film 16 or 22 as a contamination material in the step S6. As a result, the alignment control of the liquid crystal can be normally performed in the alignment film 16 or 22 and thus the alignment failure can be prevented from occurring. Thus, the light leakage cannot occur. Accordingly, in the electro-optical device, an image having high quality can be displayed.

Moreover, in the step S12 of FIG. 8, since oxygen ($O_2$) or nitrogen ($N_2$) is introduced into the second processing chamber 502 as the repair gas to repair the electrical defect portion in the inorganic material, the alignment film 16 or 22 can be formed as a precise film. Accordingly, since the alignment film 16 or 22 can be formed as the precise film, the pixel electrode 9a contained in the base of the alignment film 16 or the opposite electrode 21 contained in the base of the alignment film 22 can be prevented from coming in contact with the liquid crystal.

Furthermore, since the alignment film 16 or 22 is formed of the precise film having high film quality, the moisture absorbed into the alignment film 16 or 22 can be prevented from being diffused into the alignment film. Thus, the moisture can be prevented from permeating into the pixel electrode 9a or the opposite electrode 21.

Accordingly, in the method of manufacturing the electro-optical device according to the present embodiment, the yield can be improved and water-proofing and moisture resistance of the electro-optical device are improved. Thus, the life span can increase.

<3: Modification>

A modification of the process of manufacturing the electro-optical device according to the present embodiment will be described with reference to FIGS. 11 to 15.

<3-1: First Modification>

Figure 11:
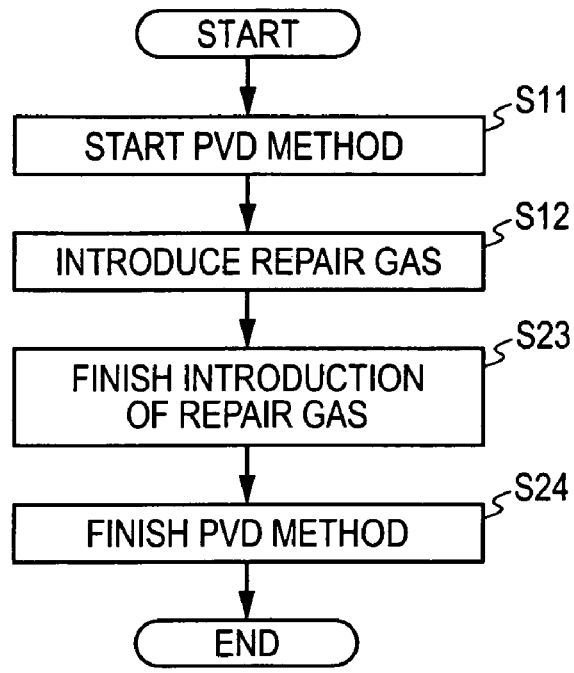
FIG. 11 is a flowchart illustrating in detail each step of a process of manufacturing of an alignment film in a first modification.

A first modification of the process of manufacturing the electro-optical device according to the present embodiment will be described with reference to FIG. 11. In the first modification, the process of manufacturing the alignment film 16 or 22 is different from that of the present embodiment. FIG. 11 is a flowchart illustrating in detail each step of the method of manufacturing of the alignment film in the first modification. Also, in the description below, the formation of the alignment film 16 of the TFT array substrate 10 will be described in detail.

In FIG. 11, the step S11 and the step S12 are performed in the second processing chamber 502. After the step S12, the introduction of the repair gas is finished (step S23) and the PVD method is then finished (step S24).

Thus, according to the first modification, the inorganic material can be deposited on the substrate surface of the TFT array substrate 10 in the second processing chamber 502 in a state where the electrical defect portion is repaired. Also, since the repair gas comes in contact with the inorganic material deposited on the substrate surface of the TFT array substrate 10, the defect portion of the inorganic material can be repaired. As the result, the film quality of the inside of the alignment film 16 is good.

<3-2: Second Modification>

Figure 12:
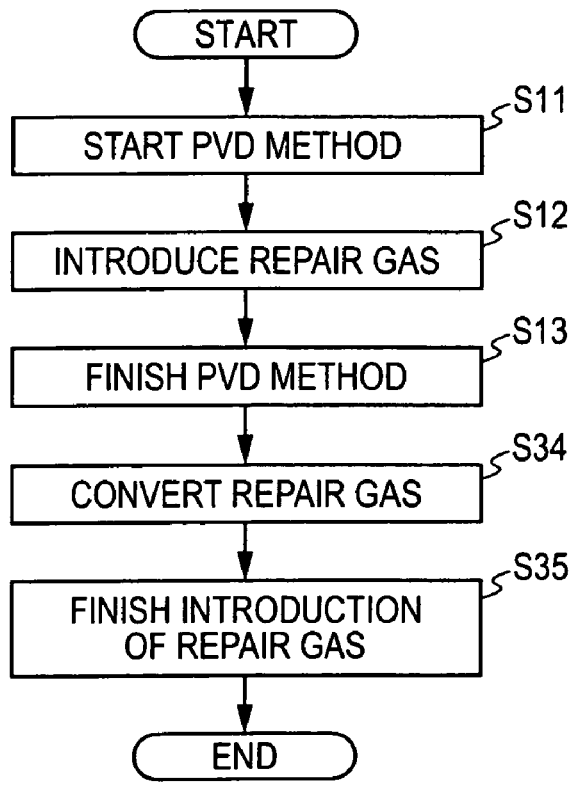
FIG. 12 is a flowchart illustrating in detail each step of a process of manufacturing of an alignment film in a second modification.

A second modification of the process of manufacturing the electro-optical device according to the present embodiment will be described with reference to FIG. 12. In the second modification, the process of manufacturing the alignment film 16 or 22 is different from that of the present embodiment. FIG. 12 is a flowchart illustrating in detail each step of the process of manufacturing of the alignment film in the second modification. Also, in the description below, the formation of the alignment film 16 of the TFT array substrate 10 will be described in detail.

In FIG. 12, the steps S11 to S13 are performed in the second processing chamber 502. In the step S12, for example, nitrogen ($N_2$) or oxygen ($O_2$) is introduced as the repair gas. Also, after the step S13, the repair gas is converted into gas having high reactivity, such as fluorine ($F_2$) or ozone ($O_3$) and is then introduced into the second processing chamber 502 (step S34). At this time, before or after the conversion of the repair gas, the repair gas is successively introduced into the second processing chamber 502. Thereafter, the introduction of the repair gas into the second processing chamber 502 is finished (step S35).

After the PVD method starts, for example, oxygen ($O_2$) or nitrogen ($N_2$) as the repair gas is introduced into the second processing chamber 502 in an initial stage of performing the PVD method, and thus an initial film of the alignment film 16 can be formed as a precise film. Thereafter, upon finishing the PVD method, the repair gas is continuously converted into gas having high reactivity, such as fluorine ($F_2$) or ozone ($O_3$), and is introduced into the second processing chamber 502 to repair the electrical defect portion at the vicinity of the uppermost surface of the alignment film 16. Thus, the film quality of the uppermost surface is more reliably good.

The film quality of the alignment film 16 is gradually changed by converting the repair gas. Accordingly, for example, in the uppermost surface of the alignment film 16, the alignment failure of the liquid crystal is prevented from occurring and the pixel electrode 9a composing the base of the alignment film 16 is prevented from coming in contact with the liquid crystal by the precise initial film and waterproofing and moisture resistance can be ensured.

Furthermore, in the second modification, after the step S12 and before the step S13 or after the step S13, a plurality kinds of repair gases are successively converted and introduced.

<3-3: Third Modification>

Figure 13:
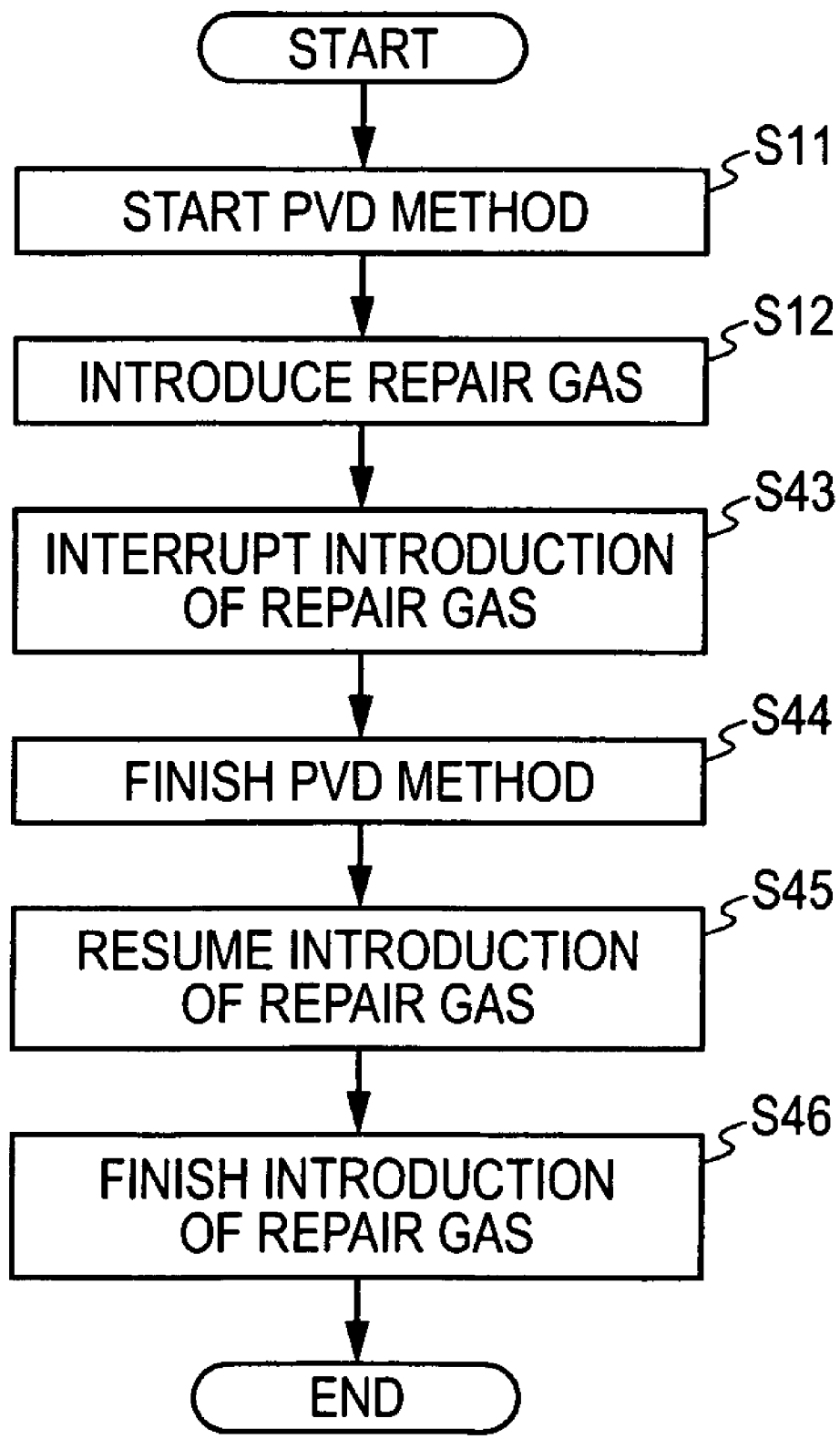
FIG. 13 is a flowchart illustrating in detail each step of a process of manufacturing of an alignment film in a third modification.

A third modification of the process of manufacturing the electro-optical device according to the present embodiment will be described with reference to FIG. 13. In the third modification, the process of manufacturing the alignment film 16 or 22 is different from that of the present embodiment. FIG. 13 is a flowchart illustrating in detail each step of the process of manufacturing of the alignment film in the third modification. Also, in the description below, the formation of the alignment film 16 of the TFT array substrate 10 will be described in detail.

In FIG. 13, the step S11 and the step S12 are performed in the second processing chamber 502. For example, in the step S12, oxygen ($O_2$) or nitrogen ($N_2$) is introduced into the second processing chamber 502 in an initial stage of the PVD method as the repair gas to form an initial film of the alignment film 16 as a precise film.

After the step S12, the introduction of the repair gas is finished (step S43) and then the PVD method is finished (step S44).

Subsequently, the repair gas is introduced into the second processing chamber 502 again (step S45). In the step S45, oxygen ($O_2$) or nitrogen ($N_2$) as the repair gas is again introduced into the second processing chamber 502 to repair the defect portion at the vicinity of the uppermost surface of the alignment film 16 and form a precise film at the vicinity of the uppermost surface. Thereafter, in the second processing chamber 502, the introduction of the repair gas is finished (step S46).

Accordingly, although the electrically unstable defect portion resides in the inside of the alignment film 16, the electrical variation of the uppermost surface of the alignment film 16 is suppressed and thus the alignment failure of the liquid crystal can be prevented. Further, since the initial film of the alignment film 16 is formed as the precise film, the pixel electrode 9a forming the base of the alignment film 16 can be prevented from contacting with the liquid crystal and waterproofing and moisture resistance can be ensured. Also, in addition to the initial film of the alignment film 16, since the uppermost film of the alignment film 16 is the precise film, water-proofing and moisture resistance can be more ensured.

Thus, according to the third modification, at least one kind of the repair gas is intermittently introduced into the second processing chamber 502 to gradually convert the film quality of the alignment film 16. Also, although a large quantity of the repair gas is not introduced into the second processing chamber 502, the film quality of the alignment film 16 can be efficiently improved.

Furthermore, in the third modification, after the step S12 and before the step S44, at least one kind of the repair gas may be intermittently introduced.

<3-4: Fourth Modification>

Figure 14:
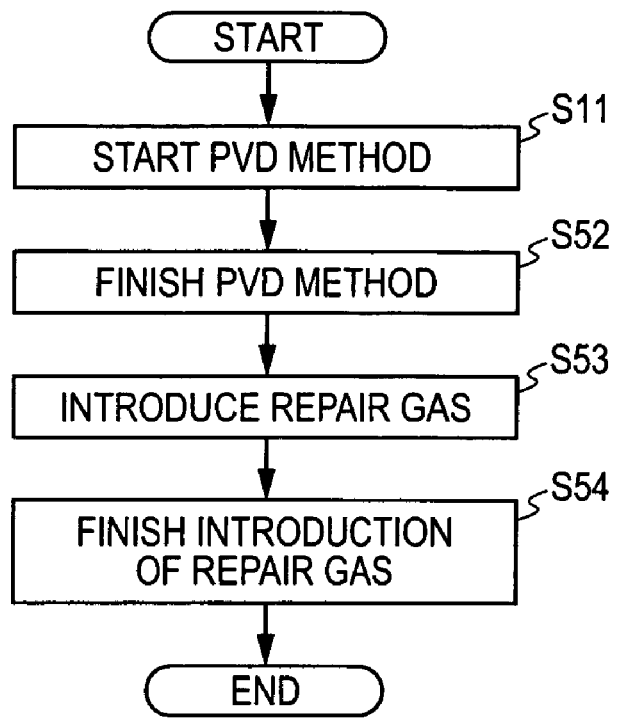
FIG. 14 is a flowchart illustrating in detail each step of a process of manufacturing of an alignment film in a fourth modification.

A fourth modification of the process of manufacturing the electro-optical device according to the present embodiment will be described with reference to FIG. 14. In the second modification, the process of manufacturing the alignment film 16 or 22 is different from that of the present embodiment. FIG. 14 is a flowchart illustrating in detail each step of the process of manufacturing of the alignment film in the fourth modification. Also, in the description below, the formation of the alignment film 16 of the TFT array substrate 10 will be described in detail.

In FIG. 14, in the second processing chamber 502, the step S11 is performed and the PVD method is then finished (step S52). Thereafter, the repair gas is introduced into the second processing chamber 502 (step S53). Since the uppermost surface of the alignment film 16 comes in contact with the repair gas, the electrical defect portion of the uppermost surface of the alignment film 16 can be more surely repaired. Accordingly, although the electrically unstable defect portion resides in the inside of the alignment film 16, the electrical variation of the uppermost surface of the alignment film 16 is suppressed, and thus the alignment failure of the liquid crystal can be prevented. Also, since the uppermost film of the alignment film 16 is the precise film, the pixel electrode 9a forming the base of the alignment film 16 can be prevented from coming in contact with the liquid crystal and water-proofing and moisture resistance can be ensured. Thereafter, in the second processing chamber 502, the introduction of the repair gas is finished (step S54).

<3-5: Fifth Modification>

Figure 15:
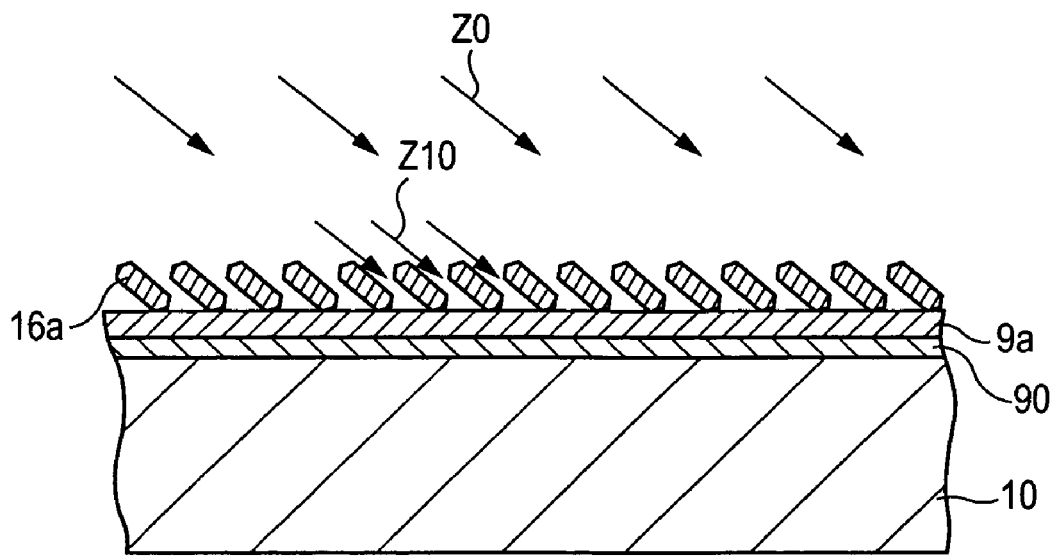
FIG. 15 is a cross-sectional view illustrating an arrangement relationship between a moving direction of repair gas and a columnar structure of the inorganic material deposited on the TFT array substrate.

A fifth modification of the process of manufacturing the electro-optical device according to the present embodiment will be described with reference to FIG. 15. In the fifth modification, the order of the introduction of the repair gas in the process of manufacturing the alignment film 16 or 22 is different from that of the present embodiment. In the fifth modification, FIG. 15 is a cross-sectional view illustrating an arrangement relationship between a moving direction of the repair gas and a columnar structure of the inorganic material deposited on the TFT array substrate 10, in the cross-sectional construction shown in FIG. 3. Also, in the description below, the formation of the alignment film 16 of the TFT array substrate 10 will be described in detail.

In the fifth modification, when the alignment film 16 is formed, the PVD method starts in the second processing chamber 502 and the repair gas is then ionized and introduced. In FIG. 15, the repair gas is introduced into the second processing chamber 502 so that an angle between the moving direction of the repair gas shown by an arrow Z0 and the substrate surface of the TFT array substrate 10 corresponds to an angle between the columnar structure 16a of the inorganic material deposited on the substrate surface and the substrate surface. Thus, as shown by the arrow Z10 of FIG. 15, the repair gas having high reactivity moves into a gap of the columnar structure 16a and thus can efficiently contact with the columnar structure 16a. Accordingly, the electrical defect portion of the inorganic material deposited on the substrate surface of the TFT array substrate 10 can be efficiently and more reliably repaired.

<4: Electronic Apparatus>

Next, various electronic apparatuses having the above-mentioned liquid crystal device will be described.

<4-1: Projector>

Figure 16:
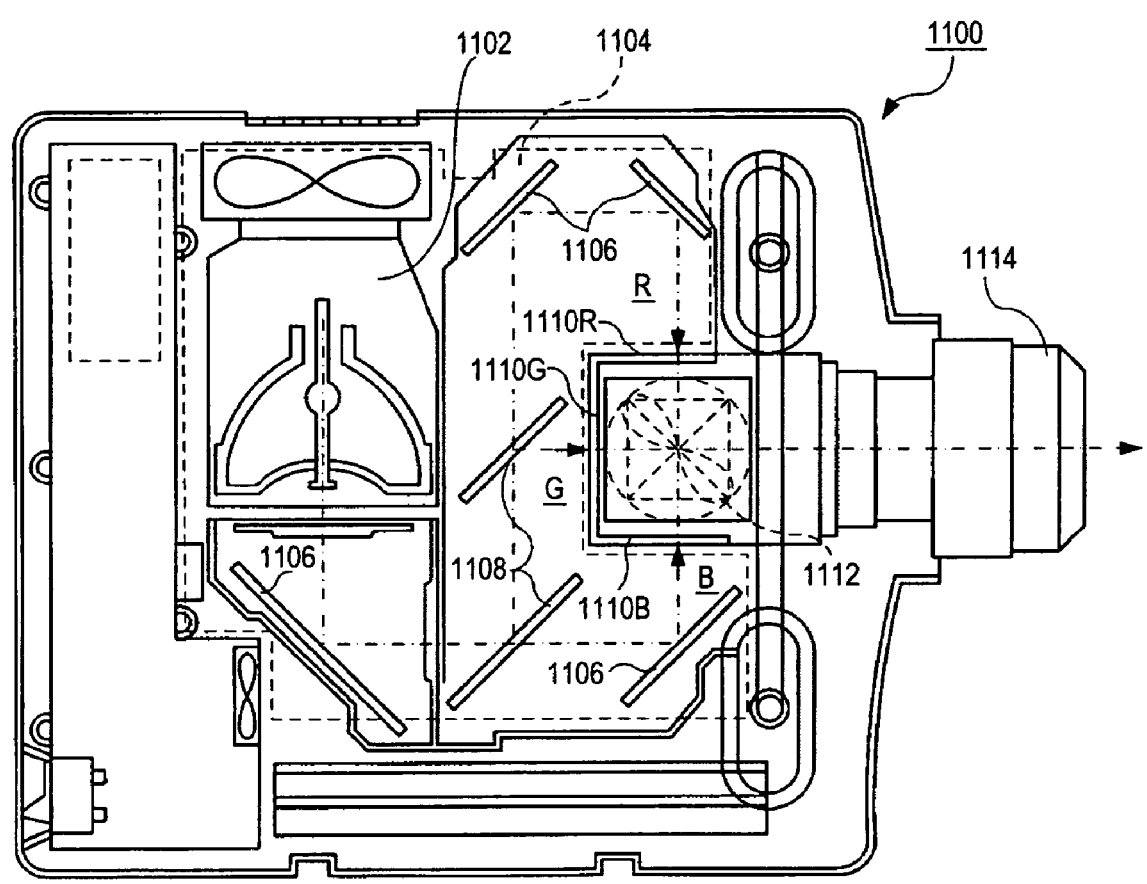
FIG. 16 is a plan view illustrating a construction of a projector which is an example of an electronic apparatus using a liquid crystal device.

First, a projector using this liquid crystal device as a light valve will be described. FIG. 16 is a plan view illustrating a construction of the projector. As shown, a lamp unit 1102 composed of a white light source, such as a halogen lamp is provided in the projector 1100. The projection light emitted from the lamp unit 1102 is divided into three primary colors RGB by four mirrors 1106 and two dichroic mirrors 1108 provided in a light guide 1104, and incident to liquid crystal panels 1110R, 1110B, and 1110G as the light valve corresponding to each of the primary colors.

The construction of the liquid crystal panels 1110R, 1110B, and 1110G is equal to that of the above-mentioned liquid crystal device and is driven by the primary color signals R, G, and B supplied from an external circuit (not shown) to an external circuit connecting terminal 102. Also, the light modulated by these liquid crystal panels is incident to a dichroic prism 1112 in three directions. In the dichroic prism 1112, the light R and the light B are refracted by 900 and the light G moves straightly. Accordingly, an image having each color is synthesized and passes through a projection lens 1114 so that a color image is projected on a screen.

Here, in the display image of each liquid crystal panels 1110R, 1110B, and 1110G, the display image of the liquid crystal panel 1110G must be horizontally inverted to the display images of the liquid crystal panels 1110R and 1110B.

Furthermore, since the light corresponding to each of the primary colors R, G, and B is incident to each of the liquid crystal panels 1110R, 1110B, and 1110G by the dichroic mirror 1108, a color filter does not need to be provided.

<4-2: Mobile Computer>

Figure 17:
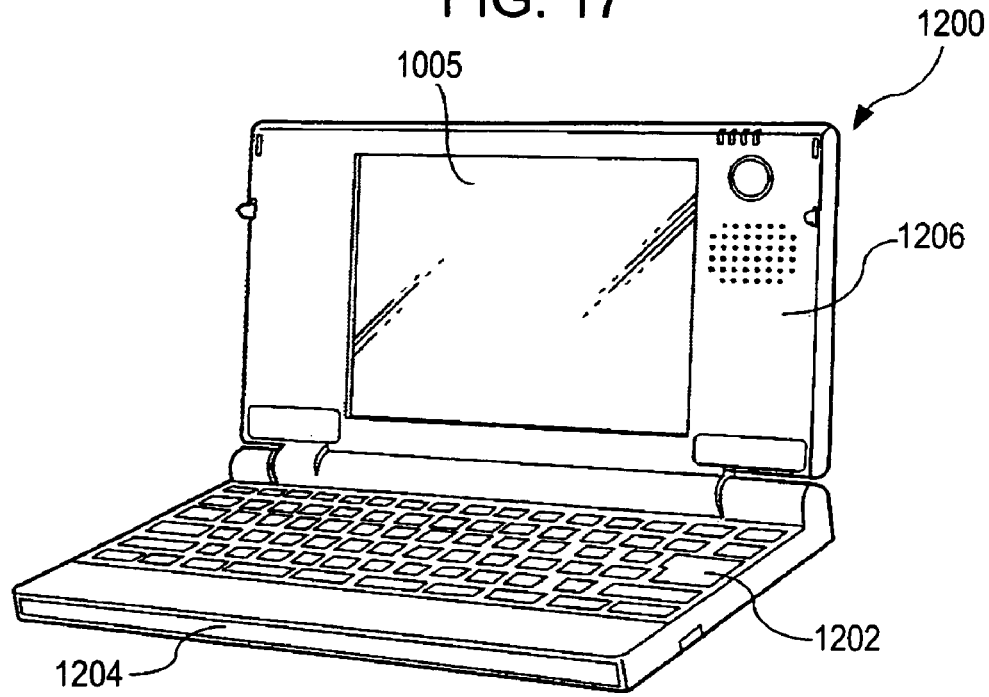
FIG. 17 is a perspective view illustrating a construction of a personal computer which is an example of the electronic apparatus using a liquid crystal device.

Next, an example of applying the liquid crystal device to a mobile personal computer will be described. FIG. 17 is a perspective view illustrating a construction of the personal computer. As shown, a computer 1200 includes a main body unit 1204 having a keyboard 1202 and a liquid crystal display unit 1206. This liquid crystal display unit 1206 is formed by adding a backlight to the rear surface of the above-mentioned liquid crystal device 1005.

<4-3: Cellular Phone>

Figure 18:
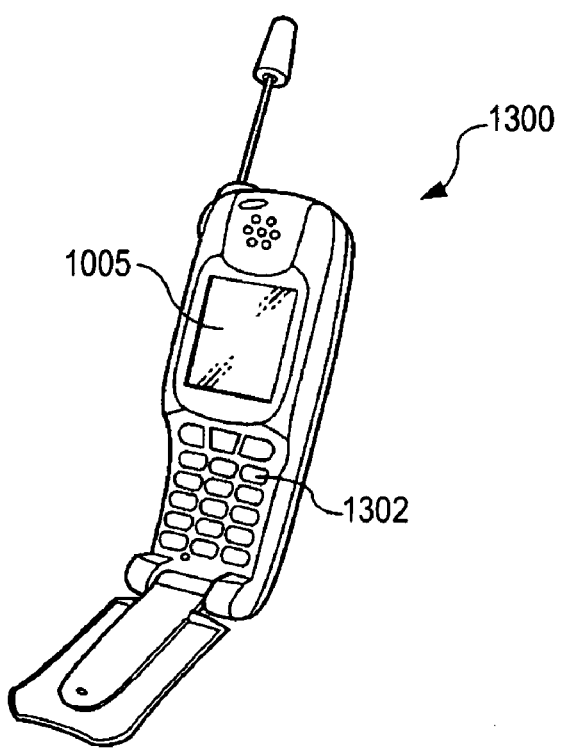
FIG. 18 is a perspective view illustrating a construction of a cellular phone which is an example of the electronic apparatus using a liquid crystal device.

Furthermore, an example of applying this liquid crystal panel to a cellular phone will be described. FIG. 18 is a perspective view illustrating a construction of the cellular phone. As shown, the cellular phone 1300 includes a plurality of operation buttons 1302 and a reflective liquid crystal device 1005. In the reflective liquid crystal device 1005, if necessary, a front light may be provided at the front surface thereof.

Furthermore, in addition to the electronic apparatuses described with reference to FIGS. 16 to 18, a liquid crystal television, a view-finder-type or monitor-direct-view-type video tape recorder, a car navigation device, a pager, an electronic organizer, an electric calculator, a word processor, a workstation, a video phone, a POS terminal, and an apparatus having a touch panel. The above-mentioned electro-optical device can be applied as the display part of various electronic apparatuses.

The invention is not limited to the above-mentioned embodiments and can be adequately changed without departing from the spirit and scope of the invention as defined by the specification and claims. A method of manufacturing an electro-optical device, an electro-optical device manufactured by the manufacturing method, and an electronic apparatus including the electro-optical device with the change are included in the technical scope of the invention.

What is claimed is:

1. A method of manufacturing an electro-optical device including a pair of substrates with an electro-optical material interposed therebetween, comprising:

forming an alignment film made of an inorganic material on a substrate surface of at least one of the substrates opposite to the electro-optical material by fixing an angle between the substrate surface and a movement direction of the inorganic material to a predetermined value and performing a Physical vapor deposition (PVD) method, in a processing chamber; and after the PVD method starts, introducing at least one kind of repair gas for repairing defects of the alignment film into the processing chamber, wherein, in the introducing of the repair gas, the introduction of the repair gas is finished before the PVD method is finished.

2. The method of manufacturing an electro-optical device according to claim 1,
wherein, in the introducing of the repair gas, at least two kinds of the repair gas are successively introduced into the processing chamber.

3. The method of manufacturing an electro-optical device according to claim 1,
wherein, in the introducing of the repair gas, the repair gas is ionized and supplied so that an angle between the substrate surface and a moving direction of the repair gas corresponds to an angle the substrate surface and a columnar structure of the inorganic material of the alignment film.

4. The method of manufacturing an electro-optical device according to claim 1,
wherein, in the introducing of the repair gas, at least one kind of gas mixture of nitrogen, argon and hydrogen, fluorine, oxygen, and ozone is used as the repair gas.

5. The method of manufacturing an electro-optical device according to claim 1,
wherein, in the forming of the alignment film, the PVD method is performed by an oblique evaporation method.

6. The method of manufacturing an electro-optical device according to claim 1,
wherein, in the forming of the alignment film, the PVD method is performed by an ion beam sputtering method.

7. A method of manufacturing an electro-optical device including a pair of substrates with an electro-optical material interposed therebetween, comprising:
forming an alignment film made of an inorganic material on a substrate surface of at least one of the substrates opposite to the electro-optical material by fixing an angle between the substrate surface and a movement direction of the inorganic material to a predetermined value and performing a Physical vapor deposition (PVD) method, in a processing chamber; and
after the PVD method starts, introducing at least one kind of repair gas for repairing defects of the alignment film into the processing chamber,
wherein, in the introducing of the repair gas, the repair gas is intermittently introduced into the processing chamber.

8. The method of manufacturing an electro-optical device according to claim 7,
wherein, in the introducing of the repair gas, the introduction of the repair gas is finished before the PVD method is finished.

9. The method of manufacturing an electro-optical device according to claim 7,
wherein, in the introducing of the repair gas, the introduction of the repair gas is finished after the PVD method is finished.

10. The method of manufacturing an electro-optical device according to claim 7,
wherein, in the introducing of the repair gas, the introduction of the repair gas starts after the PVD method is finished.

* * * * *